United States Patent
Tsukahara et al.

(10) Patent No.: US 9,909,046 B2
(45) Date of Patent: Mar. 6, 2018

(54) HEAT STORAGE MEMBER AND METHOD FOR MANUFACTURING THE SAME

(75) Inventors: Aiichiro Tsukahara, Tokyo (JP); Isami Abe, Tokyo (JP); Tetsuya Mihara, Tokyo (JP); Shu Morikawa, Tokyo (JP); Tomokazu Watanabe, Tokyo (JP)

(73) Assignees: MITSUBISHI HEAVY INDUSTRIES, LTD., Tokyo (JP); NICHIAS CORPORATION, Tokyo (JP)

( * ) Notice: Subject to any disclaimer, the term of this patent is extended or adjusted under 35 U.S.C. 154(b) by 222 days.

(21) Appl. No.: 13/574,870

(22) PCT Filed: Feb. 25, 2011

(86) PCT No.: PCT/JP2011/054244
§ 371 (c)(1),
(2), (4) Date: Jul. 24, 2012

(87) PCT Pub. No.: WO2011/105531
PCT Pub. Date: Sep. 1, 2011

(65) Prior Publication Data
US 2012/0305213 A1    Dec. 6, 2012

(30) Foreign Application Priority Data

Feb. 26, 2010   (JP) .................................. 2010-043541

(51) Int. Cl.
*F28D 20/00* (2006.01)
*C09K 5/06* (2006.01)
(Continued)

(52) U.S. Cl.
CPC .............. *C09K 5/063* (2013.01); *F28D 20/00* (2013.01); *F28D 20/023* (2013.01);
(Continued)

(58) Field of Classification Search
CPC ...... F28D 20/02; F28D 20/021; F28D 20/023; F28D 20/026
(Continued)

(56) References Cited

U.S. PATENT DOCUMENTS 4,613,444 A * 9/1986 Lane et al. ...................... 252/70
4,781,243 A * 11/1988 DeVogel et al. ................ 165/47
(Continued)

FOREIGN PATENT DOCUMENTS

FR    2875432    *    3/2006
JP    1-217136         8/1989
(Continued)

OTHER PUBLICATIONS

Gueret, FR2875432TRANS (English Translation), Mar. 2006.*
(Continued)

*Primary Examiner* — Justin Jonaitis
*Assistant Examiner* — Eric Ruppert
(74) *Attorney, Agent, or Firm* — Wenderoth, Lind & Ponack, L.L.P.

(57) ABSTRACT

A heat storage member includes a honeycomb structure having a plurality of cells, each of which is filled with capsules and a heat conductive filler. Each capsule contains a heat storage material. The heat storage member is prepared by bringing a starting material that is a mixture of the capsules into contact with the honeycomb structure to cover at least one surface of the opening of the cells of the honeycomb structure, subjecting the same to uniaxial pressure molding under the pressure of 4 MPa to 10 MPa, and filling each cell with the starting material.

3 Claims, 7 Drawing Sheets

(51) Int. Cl.
  *F28D 20/02* (2006.01)
  *H01L 23/427* (2006.01)
  *H05K 7/20* (2006.01)
(52) U.S. Cl.
  CPC ....... *H01L 23/4275* (2013.01); *H05K 7/2039* (2013.01); *H01L 2924/0002* (2013.01); *Y02E 60/142* (2013.01); *Y02E 60/145* (2013.01); *Y10T 29/4935* (2015.01)
(58) Field of Classification Search
  USPC .................................................. 165/10, 902
  See application file for complete search history.

(56) References Cited

U.S. PATENT DOCUMENTS

| | | | |
|---|---|---|---|
| 4,807,696 A * | 2/1989 | Colvin et al. | 165/10 |
| 5,224,356 A * | 7/1993 | Colvin et al. | 62/259.2 |
| 5,270,550 A * | 12/1993 | Martorana et al. | 250/505.1 |
| 5,290,904 A * | 3/1994 | Colvin et al. | 428/68 |
| 5,441,097 A * | 8/1995 | Kanda et al. | 165/10 |
| 5,532,039 A * | 7/1996 | Payne et al. | 428/116 |
| 6,319,599 B1 | 11/2001 | Buckley | |
| 6,464,672 B1 * | 10/2002 | Buckley | 604/304 |
| 2002/0164473 A1 | 11/2002 | Buckley | |
| 2002/0164474 A1 | 11/2002 | Buckley | |
| 2005/0155751 A1 * | 7/2005 | Azuma | H01L 23/3737 165/185 |
| 2009/0236079 A1 | 9/2009 | Khodadadi | |

FOREIGN PATENT DOCUMENTS

| | | |
|---|---|---|
| JP | 9-512219 | 12/1997 |
| JP | 2001-348566 | 12/2001 |
| JP | 2002-130739 | 5/2002 |
| JP | 2004-144350 | 5/2004 |
| KR | 100807971 B1 * | 2/2008 |
| RU | 2194937 | 9/2001 |
| RU | 2 276 178 C1 | 5/2006 |
| SU | 1698268 | 12/1991 |

OTHER PUBLICATIONS

Cho, KR100807971B1TRANS (English Translation), Feb. 2008.*
Office Action dated Nov. 11, 2013 in corresponding Russian Application No. 2012 131 670 (with English translation).
Decision to grant a patent on an invention dated Jun. 16, 2014 in corresponding Russian Application No. 2012131670 (with English translation).
Decision to Grant a Patent dated Aug. 19, 2014 in corresponding Japanese Application No. 2010-043541.
International Search Report dated May 10, 2011 in corresponding International Application No. PCT/JP2011/054244.
Written Opinion of the International Searching Authority dated May 10, 2011 in corresponding International Application No. PCT/JP2011/054244.
Chinese Notice of Allowance dated May 13, 2015, issued in corresponding Chinese Patent Application No. 201180007661.1.
Extended European Search Report dated Jun. 29, 2017 in European Application No. 11747487.4.

* cited by examiner

HEAT STORAGE MEMBER AND METHOD FOR MANUFACTURING THE SAME

TECHNICAL FIELD

The present invention relates to a heat storage member. More particularly, the present invention relates to a heat storage member for controlling heat of a device mounted in a spacecraft and to a method for manufacturing the same.

BACKGROUND ART

In a spacecraft such as a space satellite and rocket, for controlling heat generated from an electronic device provided inside, a heat storage member is provided between the electronic device and a structural body to absorb heat of the electronic device. The heat storage member is conventionally provided by filling a metal casing with a heat storage material.

In the field of housing, an encapsulated heat storage material is attempted to be used as a wall material or a ceiling material to maintain the heat storage effect (see Patent Literature 1).

CITATION LIST

Patent Literature

{PTL 1} Japanese Unexamined Patent Application, Publication No. 2001-348566 (Claim 1, the paragraph [0005])

SUMMARY OF INVENTION

Technical Problem

A metal casing is conventionally used for a heat storage member in a spacecraft, and is required to be designed to conform to the shape of a device. Accordingly, one unique design of the casing is necessary for one device. Thus, the manufacturing cost is increased. Moreover, heat conducting fins need to be provided at a few millimeter intervals for obtaining the heat conductivity between the heat storage members. Thus, the manufacturing cost is further increased.

The members used for the spacecraft are subjected to a vacuum environment. Accordingly, the conventional metal casing used in the spacecraft needs to have a structure endurable against an inner pressure. Thus, its mass is increased.

As a heat storage member for housing, a member provided by filling a honeycomb with an encapsulated heat storage material is known. The member using the honeycomb is light and easy to be manufactured. When the thickness of the heat storage member is increased, however, it becomes difficult to transfer heat to the heat storage member positioned away from a heating element. Thus, the heat storage effect is reduced.

An object of the present invention, which has been accomplished under the above-mentioned circumstances, is to provide a light and inexpensive heat storage member applicable to a spacecraft.

Solution to Problem

To solve the above-mentioned problems, a heat storage member according to an aspect of the present invention includes a honeycomb structural body having a plurality of cells, in which each of the cells is filled with a capsule, which contains a heat storage material, and a heat conductive filler.

According to the aspect of the present invention, the heat storage material is encapsulated and thus a metal casing is not necessary. Accordingly, the weight of the heat storage member can be reduced.

The shape of the honeycomb structural body can be changed by a simple tool, and thus the shape of the heat storage member can be easily changed to conform to the shape of a device. Thus, the manufacturing cost can be reduced.

The heat conductive filler serves as a binder and improves the heat conductivity between the encapsulated heat storage materials. Since the heat conductive filler is provided, the heat can be dispersed uniformly in the thick direction of the heat storage member even when the heat storage member is thick.

According to the aspect of the present invention, it is preferable that a filling rate of the capsule containing the heat storage material in each cell is 65% or more and 90% or less.

The heat storage effect is increased when the heat storage member contains many heat storage materials. If the amount of the capsule containing the heat storage materials is too much to fill the heat storage member, the capsules are damaged and the heat storage materials are exposed. As a result, the surrounding areas of the heat storage member become contaminated. Since the filling rate of the capsule containing the heat storage material in the cell is adjusted in the above-described range, more heat storage materials can be filled without seriously damaging the capsule. It is more preferable that the filling rate is 74%. At this time, the heat storage materials can be filled most tensely without damaging the capsule.

According to the aspect of the present invention, it is preferable that the heat conductive filler is 10 parts by weight or more and 45 parts by weight or less relative to 100 parts by weight of the capsule containing the heat storage material.

By providing the heat conductive filler in the above-described range, the heat conductivity of the heat storage member can be improved. When the heat conductive filler content is small, the heat conductive filler is not uniformly mixed with the capsule containing the heat storage material. Accordingly, it is more preferable that the heat conductive filler is 20 parts by weight or more and 45 parts by weight or less relative to 100 parts by weight of the capsule containing the heat storage material, and further preferable that the heat conductive filler is 25 parts by weight or more and 45 parts by weight or less.

According to another aspect of the present invention, a method for manufacturing a heat storage member includes: bringing a starting material that is a mixture of a capsule containing a heat storage material and a heat conductive filler into contact with a honeycomb structural body to cover at least one surface of an opening of cells of the honeycomb structural body; subjecting the starting material to pressure molding under a pressure of 4 MPa or more and 10 MPa or less; and filling each of the cells with the starting material.

Due to the pressure molding under the pressure adjusted in the above-described range, the cell can be filled with the starting material without seriously damaging the capsule containing the heat storage material. It is further preferable that the pressure during the molding is 4 MPa or more and 6 MPa or less. At this time, the cell can be filled with the starting material without damaging the capsule containing the heat storage material.

Advantageous Effects of Invention

According to the present invention, by providing the capsule, which contains the heat storage material, and the heat conductive filler in the honeycomb structural body, a light and inexpensive heat storage member having favorable heat conductivity even when the storage member is thick can be provided.

DESCRIPTION OF EMBODIMENTS

Figure 1:
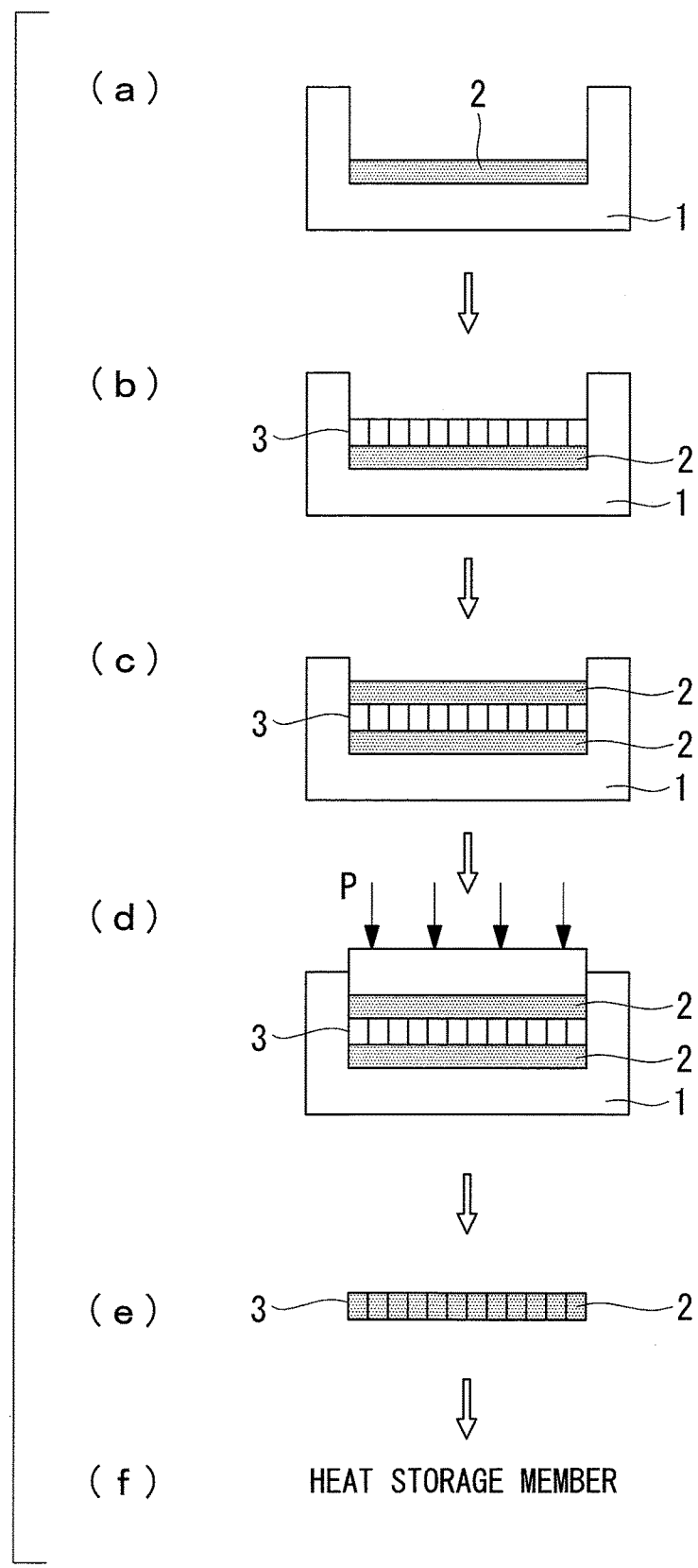
FIG. 1 shows a flowchart for explaining procedure of a method for manufacturing a heat storage member.

An embodiment of a heat storage member according to the present invention will be explained with reference to the accompanying drawings.

The heat storage member according to the embodiment is provided by filling a cell of a honeycomb structural body with a capsule, which contains a heat storage material, and a heat conductive filler.

The honeycomb structural body is composed of cell walls having an opening. The material, thickness, size, cell shape, and cell diameter of the honeycomb structural body are appropriately decided. It is only required that the honeycomb structural body is light and has favorable heat conductivity, of which the shape can be changed by a simple tool. Moreover, preferably, the honeycomb structural body is not easily broken. The honeycomb structural body according to the embodiment is made of metal mainly consisting of aluminum. The honeycomb structural body may be mainly made of stainless steel.

The heat storage material is mainly made of a compound capable of storing heat by use of latent heat caused by phase transition. It is preferable that an amount of heat needed to melt the heat storage material is in the range of approximately 100 kJ/kg to 200 kJ/kg. The heat storage material according to this embodiment is mainly made of a paraffin compound. However, it may be made of stearic acid, cetyl alcohol, or water.

The film material of the capsule is natural resin or synthetic resin. The film material of the capsule according to this embodiment is melamine resin.

The melting point and particle diameter of the capsule containing the heat storage material (hereinafter referred to as a "heat storage capsule") are appropriately decided. It is preferable that the melting point of the heat storage capsule is in the range of approximately 0° C. to 60° C. It is preferable that the particle diameter of the heat storage capsule is in the range of approximately 5 µm to 50 µm.

The heat conductive filler contains a heat-conductive material and adhesive agent. It is preferable that the heat conductivity of the heat conductive filler is in the range of approximately 5 W/(m·K) to 20 W/(m·K). For example, the adhesive agent is 5 volume % or more and 50 volume % or less relative to 100 volume % of the heat-conductive material, preferably 10 volume % or more and 40 volume % or less. The example of the heat-conductive material includes carbon materials such as carbon and metal such as silver and copper. The example of the adhesive agent includes inorganic binder such as colloidal silica, silicate soda, and cement, and thermosetting resin such as epoxy resin and phenol resin.

The heat storage capsule filling rate of the heat storage member is 65% or more and 90% or less, preferably 70% or more and 78% or less.

Next, a method for manufacturing the heat storage member according to the embodiment will be explained below.

A heat storage capsule may be prepared by filling a capsule with a heat storage material according to the known technique.

The heat storage capsule and a heat conductive filler are mixed so that the heat conductive filler is 10 parts by weight or more and 45 parts by weight or less relative to 100 parts by weight of the heat storage capsule, which is used as a starting material. Preferably, the heat storage capsule and the heat conductive filler are mixed slowly so that the capsule is not damaged.

FIG. 1 shows a flowchart for explaining procedure of the method for manufacturing the heat storage member. A half of a starting material 2 is injected into a predetermined mold 1 (FIG. 1(a)). Then, a honeycomb structural body 3 is arranged on the injected starting material 2 as shown in FIG. 1(b), and the other half of the starting material 2 is injected thereon (FIG. 1(c)).

Subsequently, the cell of the honeycomb structural body 3 is filled with the starting material 2 by uniaxial pressurization (FIG. 1(d)). The pressurization is carried out in the range of 4 MPa to 10 MPa.

Incidentally, the cell may be filled with the starting material 2 by biaxial pressurization.

The honeycomb structural body filled with the starting material 2 is demolded (FIG. 1(e)) and is left for 15 hours at 30° C. to be hardened, which is used as a heat storage member (FIG. 1(f)). The condition for hardening is not limited thereto. Other conditions are also possible as long as the starting material is hardened. For example, the honeycomb structural body may be left for 60° C. for 2 hours.

The surface grinding or surface coating may be performed on the heat storage member as needed.

Due to the surface coating, the heat storage material in the capsule is reliably prevented from leaking to the outside of the heat storage member even when the capsule is damaged. Moreover, the shape retentive property can be ensured even when the heat storage member is cut into a desired size.

The surface coating is only required to cover at least the cell opening, but may cover the entire heat storage member.

The material for the surface coating is not particularly limited. The example of the material includes ceramics such as silicate soda and aluminum phosphate, silicone rubber, fluorine-based resin such as PTFE and PFA, and metal such as aluminum and stainless steel. The surface coating may be carried out according to the conventional technique.

The thickness of the surface coating is not particularly limited. For example, the thickness may be in the range of 10 μm to 300 μm, preferably in the range of 50 μm to 200 μm.

The basis for limiting numerical numbers relating to the structure of the heat storage member and the method for manufacturing the heat storage member will be explained below.

An aluminum honeycomb (Nippon Light Metal Company, Ltd; cell diameter: 3.2 mm; foil thickness: 25 μm; size: 100 mm×100 mm×5 mm; 2.5 g) was used as the honeycomb structural body.

Two types of heat storage capsules (trade name: FP-39, FP-9) having different melting points, each of which contains a paraffin compound in a capsule made of melamine resin, were obtained from Mitsubishi Paper Mills Ltd. as the heat storage capsules. The heat storage capsule having the melting point of 39° C. was referred to as a heat storage capsule A, and the heat storage capsule having the melting point of 9° C. was referred to as a heat storage capsule B. The amounts of heat needed to melt the heat storage capsule A and the heat storage capsule B were 180 kJ/kg and 138 kJ/kg, and the particle diameters of the heat storage capsule A and the heat storage capsule B were in the range of 5 μm to 50 μm.

As a heat conductive filler, a mixture of epoxy resin and carbon having the heat conductivity of 12 W/(m·K) (trade name: SST1-80-C) was obtained from Satsuma Soken KK.

The real densities of the heat storage capsule and the heat conductive filler were measured by an air comparison pycnometer. The real densities of the heat storage capsule A and the heat storage capsule B were 0.899 g/cm$^3$ and 0.839 g/cm$^3$. The real density of the heat conductive filler was 1.291 g/cm$^3$.

(Consideration of Molding Pressure)

Test body A: The heat storage capsule A was used as a starting material. A half of the starting material was injected into a mold (inside dimension: 100 mm×100 mm) and an aluminum honeycomb was provided thereon. The other half of the heat storage capsule A was injected on the aluminum honeycomb. The uniaxial pressurization molding was carried out for one minute under the press pressure of 3 MPa to 10 MPa. It was hardened for 15 hours at 30° C. after being demolded to prepare the test body A.

Test body B: The heat storage capsule B was used as a starting material. The test body B was prepared by the same method as that used for the test body A.

The heat storage capsule filling rates of the test body A and the test body B were calculated according to the following formula.

Heat storage capsule filling rate (%)={(test body weight−aluminum honeycomb weight)/heat storage capsule real density/(test body volume−aluminum honeycomb volume)}×100

The test body weight is a measurement value for the weight of the prepared test body. The test body volume is an apparent volume of the honeycomb.

Figure 2:
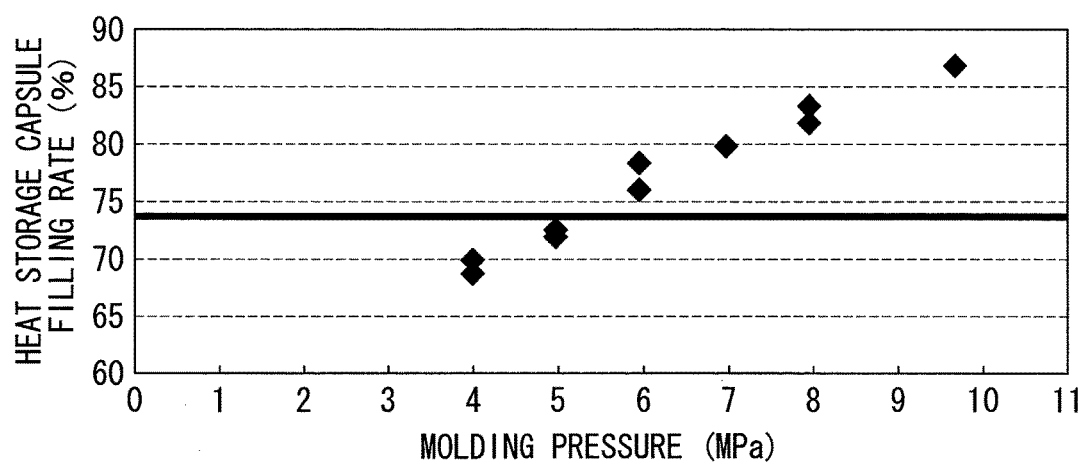
FIG. 2 shows a graph illustrating a relationship between a molding pressure and a heat storage capsule filling rate in a test body A.
Figure 3:
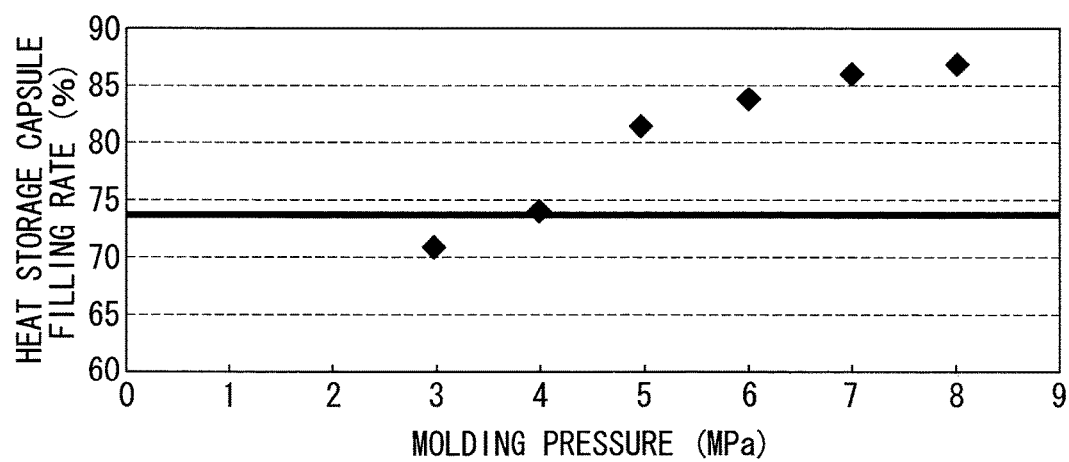
FIG. 3 shows a graph illustrating a relationship between a molding pressure and a heat storage capsule filling rate in a test body B.

The results are shown in FIG. 2 (test body A) and FIG. 3 (test body B). In the drawings, the horizontal axis indicates the molding pressure and the vertical axis indicates the heat storage capsule filling rate. According to FIGS. 2 and 3, the heat storage capsule filling rate was increased with increase of the molding pressure in both test bodies A and B. The heat storage capsule filling rates of the test bodies A and B were in the range of 65% to 90%.

The inventors confirmed from another test that the cell of the honeycomb was filled with the heat storage capsules most densely when the heat storage capsule filling rate was 74%. From this point and the above-described results, it can be said that the molding pressure is preferably 4 MPa or more.

Next, the test bodies A and B after being subjected to uniaxial pressure molding under the pressure of 4 MPa, 5 MPa, 6 MPa, and 7 MPa were observed by a scanning electron microscope.

Figure 4:
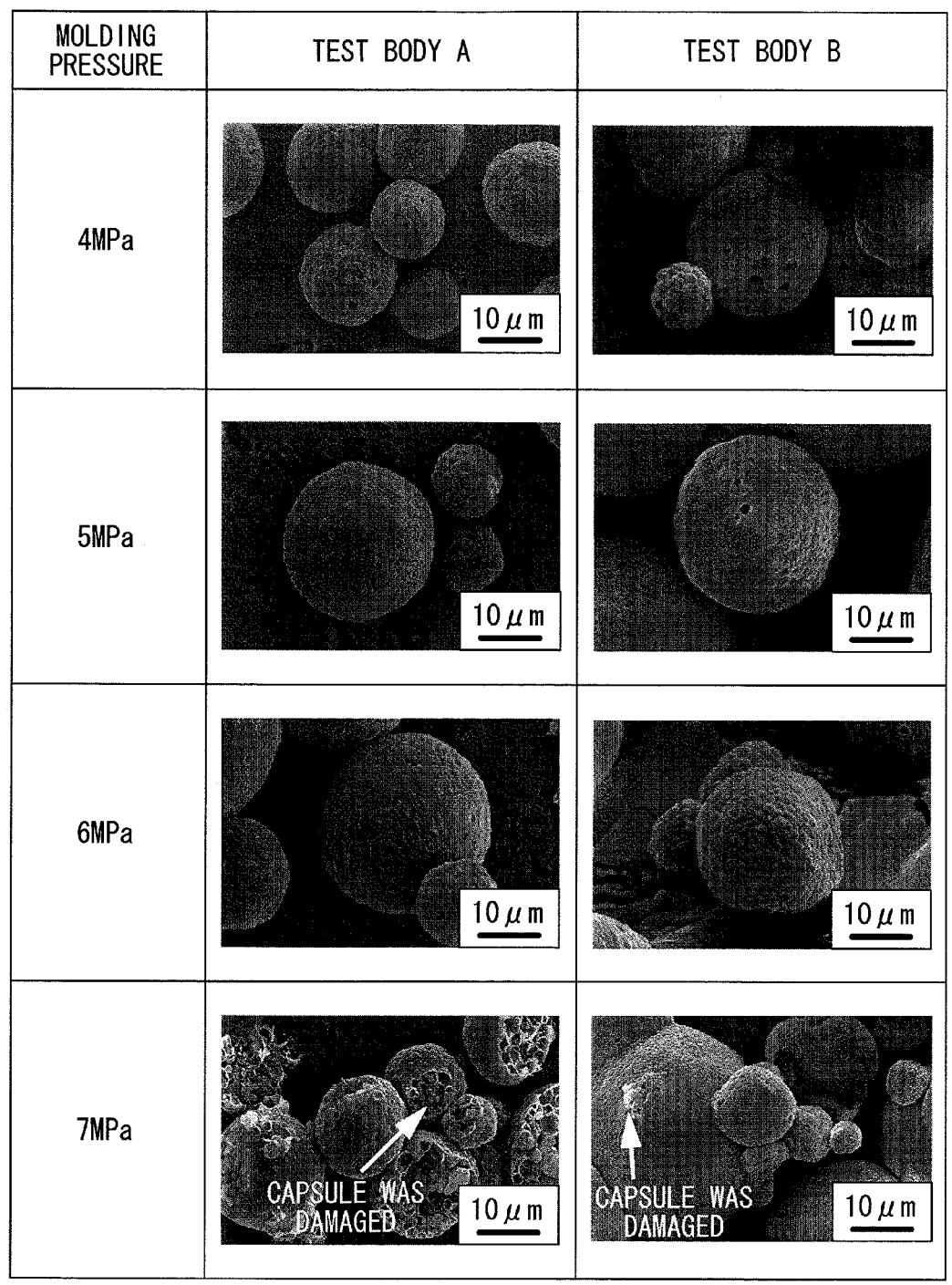
FIG. 4 shows a scanning electron micrograph of the test body A and the test body B.

The results are shown in FIG. 4. It was found from FIG. 4 that the capsules were not damaged by being pressurized during molding when the molding pressure was 6 MPa or less. When the molding pressure was 7 MPa, the damaged capsules were observed in the test bodies A and B. From these results, it can be said that the molding pressure is preferably 6 MPa or less.

(Heat Conductive Filler Content)

Test body AF: The test body AF was prepared by the same method as that used for the test body A, except that the heat storage capsule A contained the heat conductive filler to be used as a starting material so that the heat conductive filler was in the range of 0 parts by weight to 45 parts by weight relative to 100 parts by weight of the heat storage capsule A and the molding pressure was 6 MPa.

Test body BF: The test body BF was prepared by the same method as that used for the test body AF, except that the heat storage capsule B contained the heat conductive filler to be used as a starting material so that the heat conductive filler was in the range of 0 parts by weight to 45 parts by weight relative to 100 parts by weight of the heat storage capsule B.

The heat storage capsule filling rates of the test body AF and the test body BF were calculated according to the following formula.

Heat storage capsule filling rate (%)={(test body weight−aluminum honeycomb weight)×heat storage capsule blending amount/(heat storage capsule blending amount+heat conductive filler blending amount)/heat storage capsule real density/(test body volume−aluminum honeycomb volume)}×100

Figure 5:
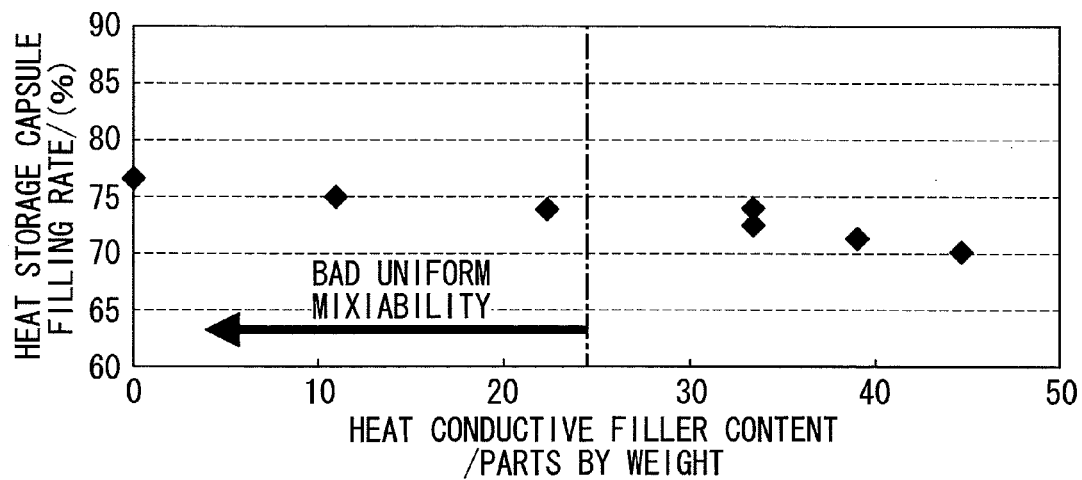
FIG. 5 shows a graph illustrating a relationship between a heat conductive filler content and a heat storage capsule filling rate in a test body AF.
Figure 6:
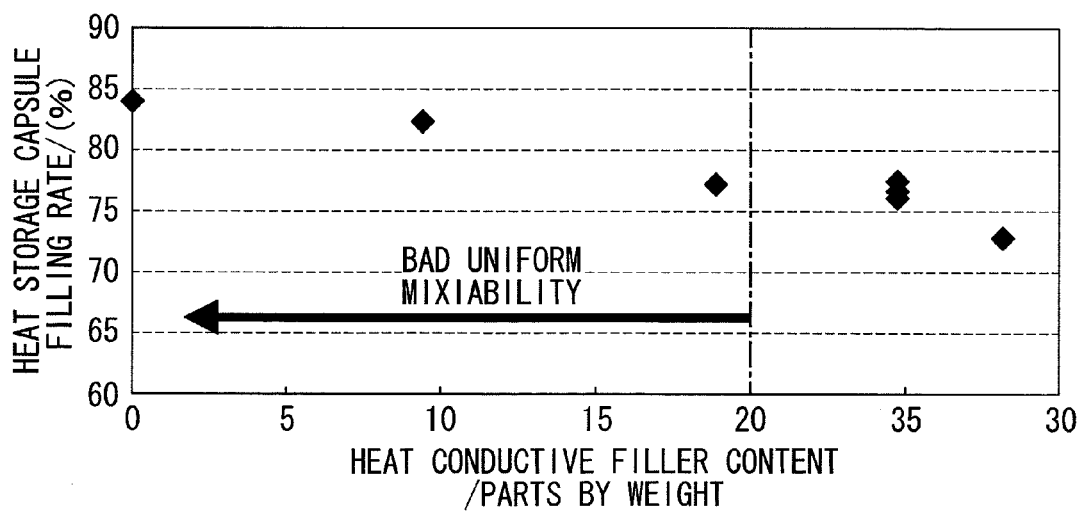
FIG. 6 shows a graph illustrating a relationship between a heat conductive filler content and a heat storage capsule filling rate in a test body BF.

The results are shown in FIG. 5 (test body AF) and FIG. 6 (test body BF). In the drawings, the horizontal axis indicates the heat conductive filler content and the vertical axis indicates the heat storage capsule filling rate. According to FIGS. 5 and 6, the heat storage capsule filling rate was decreased with increase of the heat conductive filler content in the test bodies AF and BF. However, it was found that the heat storage capsule filling rate was 70% or more even when the heat conductive filler content was 45 parts by weight relative to 100 parts by weight of the heat storage capsule A. When the heat conductive filler contents were 25 parts by weight or less and 20 parts by weight or less during preparation of the test body AF and the test body BF, respectively, the amount of the epoxy resin was not enough for uniform mixing. Thus, the filler lumps remained in the test bodies. It was found from these results that the favorable molding property was obtained when the heat conductive filler content was 25 parts by weight or more relative to 100 parts by weight of the heat storage capsule.

Next, the heat conductivities of the test bodies AF and BF were measured at 20° C. (heat flow meter method in conformity to JIS-A1412). The measurement was carried out by an AUTO λ HC-110 manufactured by EKO Instruments Co., Ltd. The size of a test piece was Φ60 mm.

Figure 7:
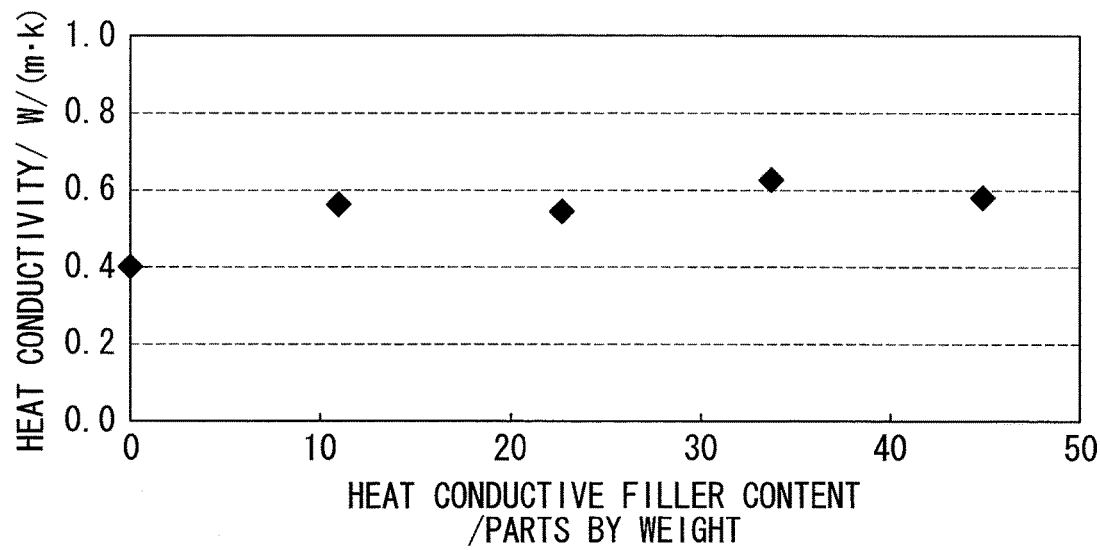
FIG. 7 shows a graph illustrating a relationship between the heat conductive filler content and a heat conductivity in the test body AF.
Figure 8:
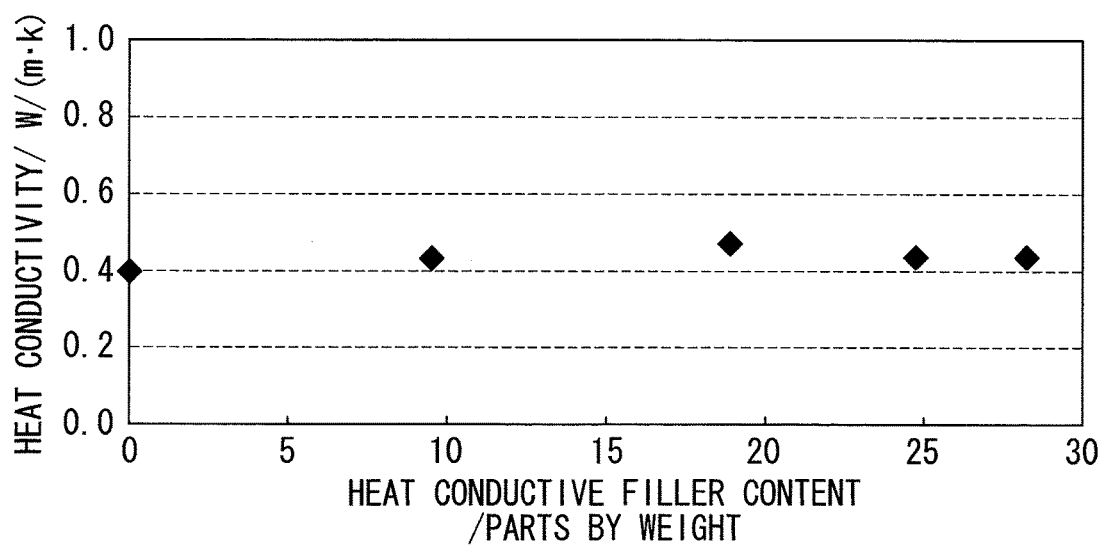
FIG. 8 shows a graph illustrating a relationship between the heat conductive filler content and a heat conductivity in the test body BF.

The results are shown in FIG. 7 (test body AF) and FIG. 8 (test body BF). In the drawings, the horizontal axis indicates the heat conductive filler content relative to 100 parts by weight of the heat storage capsule and the vertical axis indicates the heat conductivity.

According to FIGS. 7 and 8, the heat conductivities of the test bodies AF and BF were 0.4 W/(m·K) or more when the heat conductive filler was 10 parts by weight or more relative to 100 parts by weight of the heat storage capsule. The heat conductivities were increased as compared when a test body having the heat conductive filler content of 0 parts by weight. In test body AF, the heat conductivity was highest (0.62 W/(m·K)) when the heat conductive filler content was 34 parts by weight relative to 100 parts by weight of the heat storage capsule.

It was found from the above-described results that the heat conductivity was improved when the heat conductive filler content was 10 parts by weight or more relative to 100 parts by weight of the heat storage capsule and the favorable molding property was obtained when the heat conductive filler content was 25 parts by weight or more. The heat storage capsule filling rate was reduced when the content was too increased. Considering that the heat storage capsule filling rate was 74% when the cell of the honeycomb was filled with the heat storage capsule most densely, it is preferable that the heat conductive filler content is 45 parts by weight or less relative to 100 parts by weight of the heat storage capsule.

(Temperature Distribution of Heat Storage Member)

Two test bodies of the test bodies AF, in which the heat conductive filler contents were 0 parts by weight or 34 parts by weight relative to 100 parts by weight of the heat storage capsule, were overlapped to be used as a heat storage member AF0 or a heat storage member AF34.

A method for measuring the temperature distribution of the heat storage member will be explained below.

Figure 9:
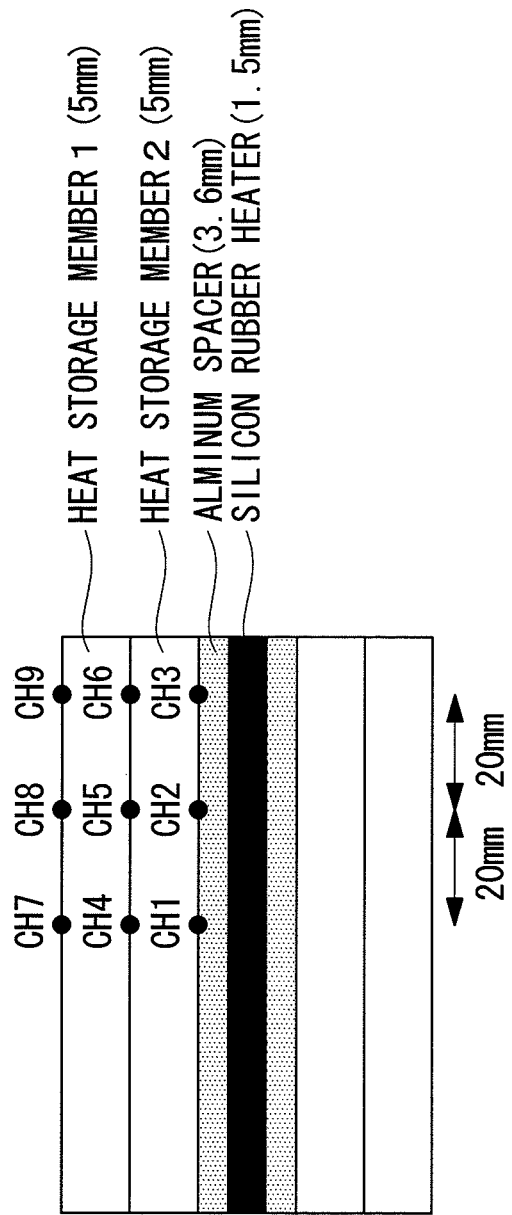
FIG. 9 is a schematic view of a temperature distribution measurement device.

FIG. 9 is a schematic view of a temperature distribution measurement device. A thermocouple was attached to the heat storage member at a predetermined position (CH1 to CH9). CH1, CH4, and CH7 were attached at the center of the surface of the heat storage member. The heat storage members were laminated and fixed to both sides of a silicon rubber heater (manufactured by ThreeHigh Co., Ltd.; 100 mm×100 mm×1.5 mm; 125Ω) as a heat source via an aluminum spacer (100 mm×100 mm×3.6 mm).

The accumulated and fixed heat storage members were surrounded by a heat insulating material (urethane foam material; thickness: 60 mm; heat conductivity: 0.0415 W/(m·K) (25° C.)) and were disposed in a thermostatic bath (manufactured by YAMATO SCIENTIFIC CO., LTD, IE21) having the temperature set at 5° C.

After it was confirmed that the temperatures of the accumulated and fixed heat storage members was stable, the heater output (20 W) was started and the temperature change was measured at predetermined positions of the storage members.

Figure 10:
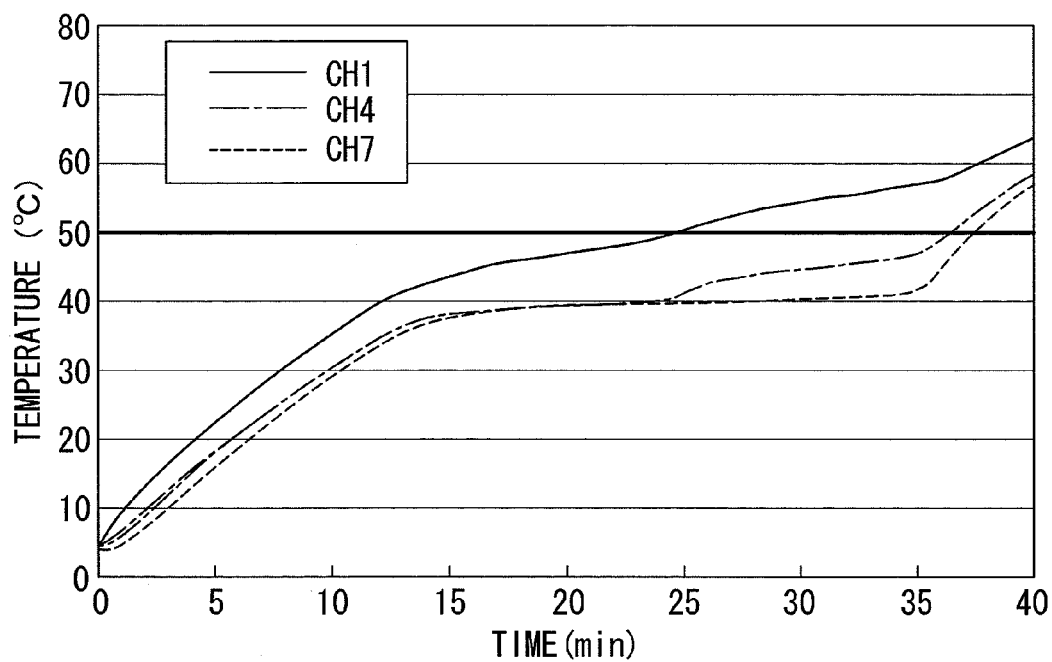
FIG. 10 shows a graph illustrating temperature change of a heat storage member AF0.
Figure 11:
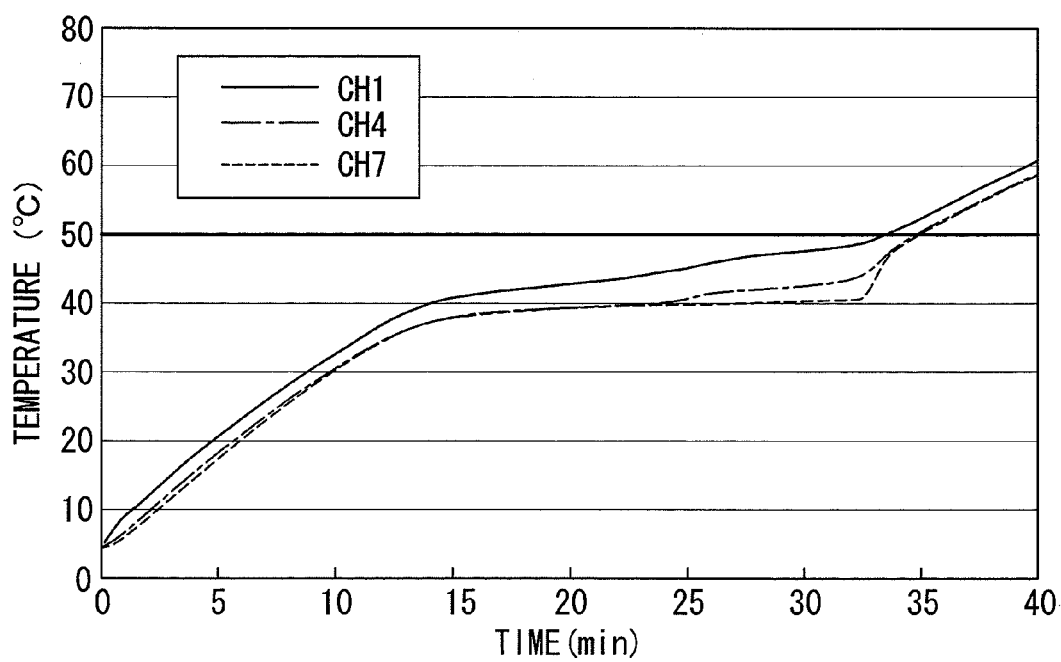
FIG. 11 shows a graph illustrating temperature change of a heat storage member AF34.

FIGS. 10 and 11 show the temperature changes at CH1, CH4, and CH7 of the heat storage members. FIG. 10 shows the temperature changes of the heat storage member AF0, and FIG. 11 shows the temperature changes of the heat storage member AF34. In FIGS. 10 and 11, the horizontal axis indicates heating time and the vertical axis indicates temperature.

According to FIGS. 10 and 11, the temperatures of both heat storage members were reduced as being away from the heat source, but the temperature distribution range of the heat storage member AF34 was narrower than that of the heat storage member AF0. In other words, the heat was uniformly dispersed in the heat storage member AF34. It was because the sensitivity for the heat was improved due to the contained heat conductive filler.

REFERENCE SIGNS LIST 1 mold
2 starting material
3 honeycomb structural body

The invention claimed is:
1. A heat storage member, comprising:
a honeycomb structure having a plurality of cells, wherein each of the cells is filled with capsules and a heat conductive filler;
each of the capsules contains a heat storage material;
the heat conductive filler is 10 to 45 parts by weight relative to 100 parts by weight of the capsules containing the heat storage material;
the heat conductive filler contains a heat-conductive material and an adhesive agent;
the heat-conductive material is a carbon material or metal;
the adhesive agent is an inorganic binder or a thermosetting resin; and the heat conductive filler has a heat conductivity which is in a range of 5 W/(m·K) to 20 W/(m·K).

2. The heat storage member according to claim 1, wherein each of the cells is filled with the capsules at a filling rate of 65% to 90%.

3. A method for manufacturing the heat storage member of claim 1, comprising: bringing a starting material that is a mixture of a capsule, which contains a heat storage material, and a heat conductive filler into contact with a honeycomb structural body to cover at least one surface of an opening of cells of the honeycomb structural body;
subjecting the starting material to pressure molding under a pressure of 4 MPa or more and 10 MPa or less; and filling each of the cells with the starting material.

* * * * *